(12) United States Patent
Kwon

(10) Patent No.: US 10,558,594 B2
(45) Date of Patent: Feb. 11, 2020

(54) MEMORY DEVICE, THE CONTROL METHOD OF THE MEMORY DEVICE AND THE METHOD FOR CONTROLLING THE MEMORY DEVICE

(71) Applicant: Essencore Limited, Hong Kong (CN)

(72) Inventor: Seok Cheon Kwon, Yongin-si (KR)

(73) Assignee: ESSENCECORE LIMITED, Wanchai (HK)

( * ) Notice: Subject to any disclaimer, the term of this patent is extended or adjusted under 35 U.S.C. 154(b) by 0 days.

(21) Appl. No.: 15/988,387

(22) Filed: May 24, 2018

(65) Prior Publication Data

US 2019/0361823 A1 Nov. 28, 2019

(51) Int. Cl.
| | | |
|---|---|---|
| G11C 11/34 | (2006.01) | |
| G11C 16/04 | (2006.01) | |
| G06F 13/16 | (2006.01) | |
| G06F 12/02 | (2006.01) | |
| G11C 16/28 | (2006.01) | |

(Continued)

(52) U.S. Cl.
CPC ...... *G06F 13/1689* (2013.01); *G06F 12/0246* (2013.01); *G11C 16/08* (2013.01); *G11C 16/28* (2013.01); *G11C 16/32* (2013.01)

(58) Field of Classification Search
CPC . G06F 13/1689; G06F 12/0246; G11C 16/08; G11C 16/28; G11C 16/32
See application file for complete search history.

(56) References Cited

U.S. PATENT DOCUMENTS

2008/0086589 A1* 4/2008 Urabe ................ G06F 13/1668
711/103
2008/0086590 A1* 4/2008 Urabe ................ G06F 13/1668
711/103

(Continued)

FOREIGN PATENT DOCUMENTS

| TW | 200834589 A | 8/2008 |
| TW | 200937420 A | 9/2009 |
| TW | 201633053 A | 9/2016 |

OTHER PUBLICATIONS

Office Action received for Taiwan Patent Application No. 107117825, dated Jan. 23, 2019, 34 pages (15 pages of English Translation and 19 pages of Office Action).

*Primary Examiner* — Toan K Le
(74) *Attorney, Agent, or Firm* — Womble Bond Dickinson (US) LLP; John J. Penny, Jr.

(57) ABSTRACT

An asynchronous NAND-type memory device includes a circuit configured to perform an operation based on a signal, a first pin configured to obtain an operation control signal, a second pin configured to output a data output reference signal, and a third pin configured to output data in synchronization with the data output reference signal. The circuit is provided such that the first pin obtains, from the external device, the operation control signal that is transitioned at a second time point after a first time point at which the memory device enters into a ready state, the second pin outputs the data output reference signal, which is transitioned at a third time point that is later than the second time point by a predetermined time interval, and the third pin outputs the data in synchronization with the operation control signal which is periodically transitioned, from the third time point.

21 Claims, 11 Drawing Sheets

(51) Int. Cl.
*G11C 16/32* (2006.01)
*G11C 16/08* (2006.01)

(56) References Cited

U.S. PATENT DOCUMENTS

| | | | | |
|---|---|---|---|---|
| 2008/0141059 A1* | 6/2008 | Kim | ............. | G06F 1/12 |
| | | | | 713/400 |
| 2009/0164830 A1* | 6/2009 | Oh | ............. | G06F 1/3203 |
| | | | | 713/600 |
| 2009/0259873 A1* | 10/2009 | Oh | ............. | G06F 1/12 |
| | | | | 713/401 |
| 2011/0235426 A1* | 9/2011 | Oh | ............. | G11C 7/10 |
| | | | | 365/185.18 |
| 2012/0113733 A1* | 5/2012 | Kim | ............. | G11C 5/063 |
| | | | | 365/193 |
| 2015/0310916 A1* | 10/2015 | Leem | ............. | G06F 12/0246 |
| | | | | 711/103 |
| 2016/0117995 A1* | 4/2016 | Lee | ............. | G09G 3/20 |
| | | | | 345/691 |
| 2016/0358657 A1* | 12/2016 | Kim | ............. | G11C 16/10 |
| 2017/0060453 A1* | 3/2017 | Kodera | ............. | G06F 13/4282 |
| 2017/0357581 A1* | 12/2017 | Yanagidaira | ............. | G06F 13/16 |

* cited by examiner

MEMORY DEVICE, THE CONTROL METHOD OF THE MEMORY DEVICE AND THE METHOD FOR CONTROLLING THE MEMORY DEVICE

1. FIELD OF THE INVENTION

The present invention relates to a memory device, a control method of the memory device, and a method of controlling the memory device, and more particularly, to an asynchronous NAND-type memory device configured to process data at a higher speed, a control method of the memory device, and a method of controlling the memory device.

2. DISCUSSION OF RELATED ART

Semiconductor memory devices may be memory devices, which are used to store data and implemented using semiconductors, such as silicon, germanium, and gallium arsenide. The semiconductor memory devices may be typically classified into volatile memory devices and non-volatile memory devices.

A volatile memory may be a memory device configured to lose stored data when power supply is interrupted. Volatile memories may include static random access memories (SRAMs), dynamic RAMs (DRAMs), synchronous DRAMs (SDRAMs), and the like, and non-volatile memories may include read-only memories (ROMs), programmable ROMs (PROMs), electrically programmable ROMs (EPROMs), flash memory devices, and the like. Among these, the flash memory devices may be broadly divided into NOR type flash memory devices and NAND type flash memory devices.

An interface of a control device configured to perform data read, write, and erase operations using a NAND flash memory device has widely been used. However, with gradual improvement of specifications of processors and continuous development of software technology, it is necessary to develop a memory device and an interface capable of processing data at a higher speed.

SUMMARY OF THE INVENTION

The present invention is directed to providing a memory device, a control method of the memory device, and a method of controlling the memory device.

Further, the present invention is directed to providing an asynchronous NAND-type memory device, a control method of the asynchronous NAND-type memory device, and a method of controlling the memory device.

Furthermore, the present invention is directed to providing a memory device having an improved data processing speed, a control method of the memory device, and a method of controlling the memory device.

According to an aspect of the present invention, there is provided a memory device which is an asynchronous NAND-type memory device, the memory device including: a circuit configured to perform an operation based on a signal obtained from an external device, a first pin configured to obtain an operation control signal from the external device, a second pin configured to output a data output reference signal to the external device, and a third pin configured to output data to the external device in synchronization with the data output reference signal.

The circuit is provided such that the first pin obtains, from the external device, the operation control signal that is transitioned at a second time point after a first time point at which the memory device enters into a ready state, and subsequently periodically transitioned at first periods, the second pin outputs the data output reference signal, which is transitioned at a third time point that is later than the second time point by a predetermined time interval, wherein the data output reference signal is output in synchronization with the operation control signal which is periodically transitioned, and the third pin outputs the data in synchronization with the operation control signal which is periodically transitioned, from the third time point.

According to another aspect of the present invention, there is provided a method of controlling a memory device which is a NAND-type memory device, the method including: outputting an operation control signal to the memory device when the memory device enters into a ready state at a first time point, wherein the operation control signal is transitioned at a second time point after the first time point and subsequently periodically transitioned at first periods, obtaining a data output reference signal from the memory device in response to the operation control signal output to the memory device, wherein the data output reference signal is transitioned at a third time point, which is later than the second time point by a predetermined time interval, and output in synchronization with the operation control signal which is periodically transitioned, and obtaining data output in synchronization with the data output reference signal from the third time point.

According to another aspect of the present invention, there is provided a control method of a memory device which is a NAND-type memory device, the method including: allowing the memory device to enter into a ready state and obtaining an operation control signal from an external device, wherein the operation control signal is transitioned at a second time point after a first time point at which the memory device enters into the ready state, outputting a data output reference signal to the external device in response to the operation control signal obtained from the external device, wherein the data output reference signal is transitioned at a third time point, which is later than the second time point by a predetermined time interval, and outputting data in synchronization with the data output reference signal.

Aspects of the present invention should not be limited by the above description, and other unmentioned aspects will be clearly understood by one of ordinary skill in the art from exemplary embodiments set forth therein and the accompanying drawings.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1:
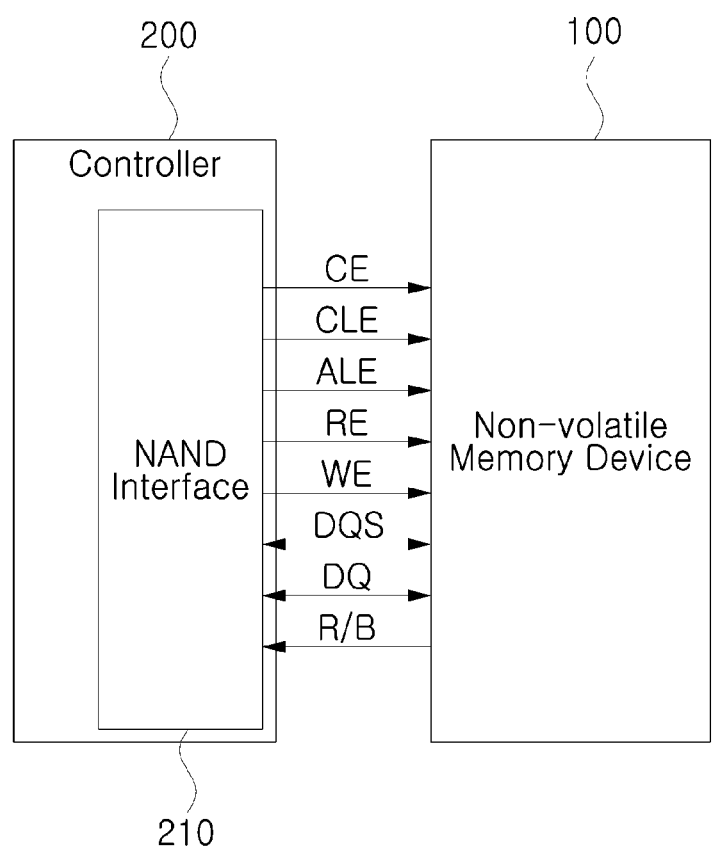
FIG. 1 illustrates a memory system according to an exemplary embodiment of the present invention.

The foregoing objects, features, and advantages of the present invention will become more apparent from the following detailed descriptions as illustrated in the accompanying drawings. While the invention is susceptible to various modifications and may take on various alternative forms, specific embodiments thereof are shown by way of example in the drawings and will herein be described in detail.

In the drawings, the thicknesses of layers and regions are exaggerated for clarity. It will be understood that when an element or layer is referred to as being "on" another element or layer, it can be directly on another element or layer or intervening layers or elements may be present. Like reference numerals refer to like elements throughout in principle. Further, the same reference numerals are used to describe components having the same function within the same scope shown in the drawings of the embodiments.

A detailed description of known functions and configurations incorporated therein will be omitted not to unnecessarily obscure the gist of the present invention. Further, numerals (e.g., first, second, etc.) used in the description of the present invention are only used to distinguish one component from another.

In addition, terms "module" and "unit" used for components in the following description are given or used interchangeably in consideration of only the ease of specification and do not have their own meanings or roles that are distinguished from each other.

Methods according to exemplary embodiments may be implemented in the form of program commands that may be executed using various computer units, and recorded on computer-readable recording media. The computer-readable recording media may include program commands, data files, data structures, and the like, alone or in combination. The program commands recorded on the computer-readable recording media may be specifically designed and configured for the exemplary embodiments or may be available to one skilled in the art of computer software. Examples of the computer-readable recording media may include magnetic media such as hard disks, floppy disks, and magnetic tapes, optical media such as compact disc-read-only memory (CD-ROM) and digital versatile disc (DVD), magneto-optical media such as floptical disks, and hardware devices such as ready-only memories (ROMs), random-access memories (RAMs), flash memories, and the like, which are specifically configured to store and execute program commands. Examples of the program commands may include not only machine language codes such as those produced by a compiler but also high-level language codes that may be executed by a computer using an interpreter or the like. The above-described hardware devices may be configured to operate as at least one software module to perform operations of the embodiments, and vice versa.

Hereinafter, a non-volatile memory device and a control method of the non-volatile memory device will be described. Specifically, the non-volatile memory device and the control method of the non-volatile memory device according to the present invention may be applied to a non-volatile memory device using a double data rate (DDR) method, such as a toggle-type NAND flash memory device or the like.

Toggle-type NAND flash memory devices and system and the like may be operated using both rising edges and falling edges of signals. A toggle-type NAND flash memory device or the like uses three commands, namely, erase, read, and write commands, like a single-data-rate (SDR)-type NAND flash memory device. However, a bi-directional data strobe (DQS) pin port is additionally used as a DQS pin.

To begin with, a system including a memory device and a control device according to an exemplary embodiment of the present invention will be described.

FIG. 1 illustrates a memory system according to an exemplary embodiment of the present invention.

Referring to FIG. 1, the memory system according to the exemplary embodiment of the present invention may include a NAND memory device 100 and a control device 200.

The control device 200 may perform a control operation on the memory device 100. The control device 200 may include a NAND interface 210. The NAND interface 210 may output a signal to the NAND memory device 100 or receive a signal from the NAND memory device 100 and control an operation of the NAND memory device 100.

The control device 200 may provide addresses, commands, control signals, and the like to the memory device 100 and control write (or program), read, and erase operations on the memory device 100. Specifically, the control device 200 may output a chip enable (CE) signal, a command latch enable (CLE) signal, and an address latch enable (ALE) signal to the memory device 100. Further, the control device 200 may output a read enable (RE) signal and a write enable (WE) signal to the memory device 100. In addition, the control device 200 may obtain a ready/busy (R/B) signal from the memory device 100.

When the control device 200 performs a write or read operation on the memory device 100, the control device 200 may transmit data to the memory device 100 through a data input/output (DQ) pin port or receive data from the memory device 100 through the DQ pin port. Further, when the control device 200 performs the write or read operation on the memory device 100, the control device 200 may transmit a DQS signal to the memory device 100 through a DQS port (or a DQS pin port) or receive the DQS signal from the memory device 100 through the DQS port.

The memory device 100 may receive the CE signal, the CLE signal, and the ALE signal from the control device 200. The memory device 100 may receive the RE signal and the WE signal from the control device 200. Further, the control device 200 may output an R/B signal to the memory device 100.

Figure 2:
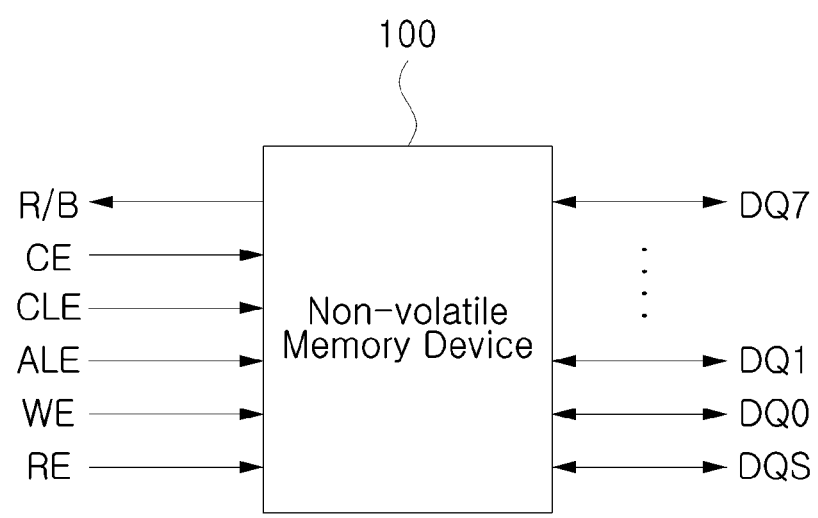
FIG. 2 schematically illustrates a memory device according to an exemplary embodiment of the present invention.

FIG. 2 is a schematic diagram of a memory device 100 according to an exemplary embodiment of the present invention.

Referring to FIG. 2, the memory device 100 according to the exemplary embodiment of the present invention may include a plurality of pins. In a specific example, the memory device 100 according to the exemplary embodiment of the present invention may include an R/B pin, a CE pin, a CLE pin, an ALE pin, a WE pin, an RE pin, a DQ pin, and a DQS pin. However, the above-described embodiment is only an example of the memory device 100, and the memory device 100 or the like disclosed in the present invention is not limited thereto. The memory device 100 may further include additional pins or some pins may be omitted from the memory device 100.

The R/B pin may output an R/B signal indicating a state of the memory device 100 to the outside. The R/B pin may output the R/B signal indicating a ready state or busy state of the memory device 100 to the outside.

The CE pin may receive a CE signal for activating the memory device 100.

The CLE pin may receive, from the outside, a CLE signal indicating that data input through DQ pins (e.g., DQ0 to DQ7) is a command.

The ALE pin may receive, from the outside, an ALE signal indicating that data input through the DQ pins (e.g., DQ0 to DQ7) is an address.

The WE pin may receive a WE signal. In an example, the WE signal may be used to control the latching of commands and addresses.

The RE pin may receive an RE signal. In an example, the RE signal may enable continuous data output.

The DQ pin may output or receive data. A plurality of DQ pins may be provided. For example, the memory device 100 may include an 8-bit port including the DQ pins DQ0 to DQ7.

The DQS pin may output or receive a DQS signal indicating a valid window of data.

Figure 3:
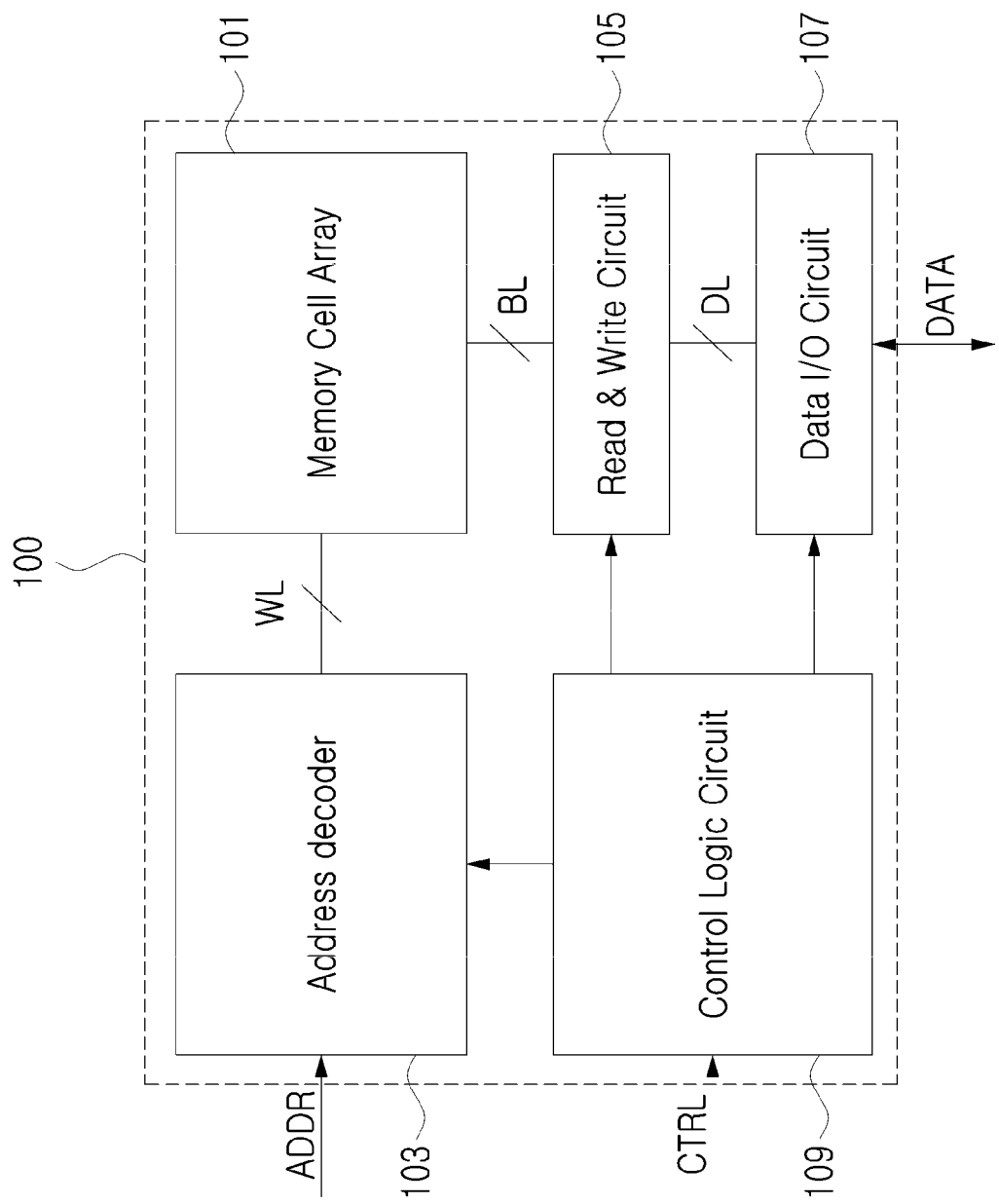
FIG. 3 is a block diagram of a configuration of a memory device according to an exemplary embodiment of the present invention.

FIG. 3 is a block diagram of a configuration of a memory device according to an exemplary embodiment of the present invention.

Referring to FIG. 3, a memory device 100 according to the exemplary embodiment of the present invention may include a memory cell array 101, an address decoder 103, a read/write circuit 105, a data I/O circuit 107, and a control logic circuit 109.

The memory cell array 101 may be connected to the address decoder 103 through a word line WL and connected to the read/write circuit 105 through a bit line BL. The memory cell array 101 may include a plurality of memory cells. The memory cell array 101 may be configured to store at least one bit per cell.

The address decoder 103 may receive addresses ADDR from the outside. The address decoder 103 may be connected to the memory cell array 101 through the word line WL. The address decoder 103 may operate in response to control of the control logic circuit 109.

The address decoder 103 may decode a row address from among received addresses ADDR and select a word line WL based on the decoded row address. The address decoder 103 may decode a column address from among the received addresses ADDR. The decoded column address may be transmitted to the read/write circuit 105.

The read/write circuit 105 may be connected to the memory cell array 101 through the bit line BL and be connected to the data I/O circuit 107 through a data line DL. The read/write circuit 105 may operate according to the control of the control logic circuit 109. The read/write circuit 105 may receive the decoded column address from the address decoder 103 and select a bit line BL using the decoded column address.

According to an exemplary embodiment, the read/write circuit 105 may receive data from the data I/O circuit 107 and input the received data to the memory cell array 101. Alternatively, the read/write circuit 105 may obtain data from the memory cell array 101 and transmit the obtained data to the data I/O circuit 107. The read/write circuit 105 may obtain predetermined data from one region of the memory cell array 101 and store the predetermined data in another region of the memory cell array 101. For example, the read/write circuit 105 may perform a copy-back operation.

In another exemplary embodiment, the read/write circuit 105 may include sub-components, such as a page buffer (or register), a column selection circuit, a sense amplifier, a write driver, and the like.

The data I/O circuit 107 may be connected to the read/write circuit 105 through the data line DL. The data I/O circuit 107 may operate according to the control of the control logic circuit 109. The data I/O circuit 107 may exchange data DATA with an external device. The data I/O circuit 107 may transmit externally obtained data to the read/write circuit 105 through the data line DL or output data DATA from the read/write circuit 105 through the data line DL to the outside. For example, the data I/O circuit 107 may include a data buffer or the like.

The control logic circuit 109 may be connected to an address decoder 120, the read/write circuit 105, and the data I/O circuit 107. The control logic circuit 109 may be configured to control overall operations of the memory device 100. The control logic circuit 109 may operate based on a control signal CTRL received from the outside.

The control logic circuit 109 may include a program/erase number counter configured to count the number of times a program/erase operation is performed per block of the memory device 100. The program/erase number counter may be implemented as a digital circuit, an analog circuit, or a combination thereof. The program/erase number counter may be implemented as software driven in the control logic circuit 109 or a combination of software and hardware.

Figure 4:
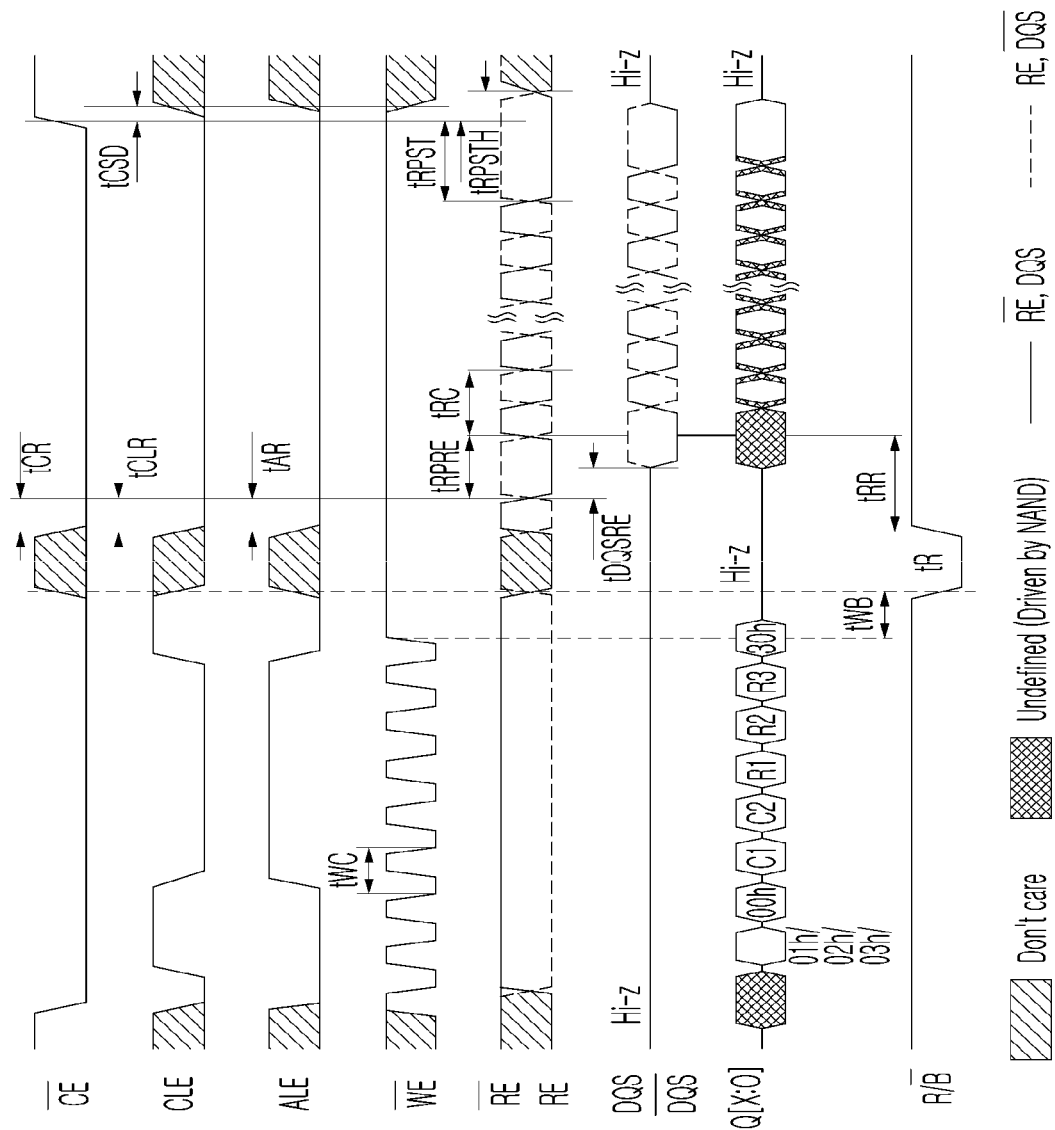
FIG. 4 is a timing diagram of main signals in a memory device according to an exemplary embodiment of the present invention.

FIG. 4 is a timing diagram of main signals in a memory device 100 according to an exemplary embodiment of the present invention. Specifically, FIG. 4 illustrates timing relationships between main signals when the memory device 100 receives a command signal and an address signal and performs a data read operation based on the command signal and the address signal.

Referring to FIG. 4, the memory device 100 according to the exemplary embodiment of the present invention may receive a command (e.g., 00 h) from the outside when a CE signal is activated (falling) and a CLE signal is activated (rising) (a DQ signal). Further, when the CE signal is activated (falling), the CLE signal is deactivated (falling), and an ALE signal is activated (rising), the memory device 100 may receive an address from the outside (a DQ signal). The memory device 100 may receive the address and receive a command (e.g., 30 h) again. In this case, a WE signal may be periodically transitioned between a logic high and a logic low at periods of tWC.

Referring to FIG. 4, when the memory device 100 receives the address and the command, an RIB signal may enter into a busy state (falling). The RIB signal may enter into the busy state after a time duration tWB from a time point at which a final command is input, remain in the busy state for a time duration tR, and change into a ready state (rising) again. In the busy state, the memory device 100 may get ready for an operation in response to the command. In the busy state, the CE signal may be in an inactive state, and the CLE signal and the ALE signal may be in an active state.

Referring to FIG. 4, when a predetermined time duration tCR, tCLR, or tAR has elapsed after the memory device 100 entered into the ready state, the memory device 100 may receive an RE signal. The RE signal may be maintained in a transitioned state for a predetermined time duration (e.g., tRPRE). tRPRE may be a read preamble time duration. When the read preamble time duration has elapsed, the RE signal may be periodically transitioned between a logic high and a logic low at periods of tRC. After the RE signal is periodically transitioned for a predetermined time duration, the RE signal may be maintained for a predetermined time duration. tRPST may be a read postamble time. tRPSTH may refer to a read postamble hold time. A parameter tRR may refer to a time duration between a time point at which the memory device 100 enters into a ready state and a time point at which data is output. The RE signal may be a differential pair signal RE and nRE. Referring to FIG. 4, when a predetermined time has elapsed after the memory device 100 entered into the ready state, the memory device 100 may output a DQS signal after a predetermined time duration tDQSRE from a time point at which the RE signal is transitioned. The DQS signal may be delayed for the time duration tDQSRE with respect to the RE signal and output. That is, the DQS signal may be delayed for the time duration tDQSRE with respect to the RE signal and transitioned, and form a waveform that is delayed for the time duration tDQSRE with respect to the RE signal. The DQS signal may be a differential pair signal.

Referring to FIG. 4, the memory device 100 may output a DQ signal in synchronization with the DQS signal. The memory device 100 may delay the DQ signal for the time duration tDQSRE with respect to the RE signal and output the delayed DQ signal in synchronization with the DQS signal. In other words, the DQ signal and/or the DQS signal may be output asynchronous to the RE signal.

tCSD may be a hold time from a time point at which a chip enable signal is deactivated to a time point at which the CLE signal, the ALE signal, and the WE signal are transitioned.

Figure 5:
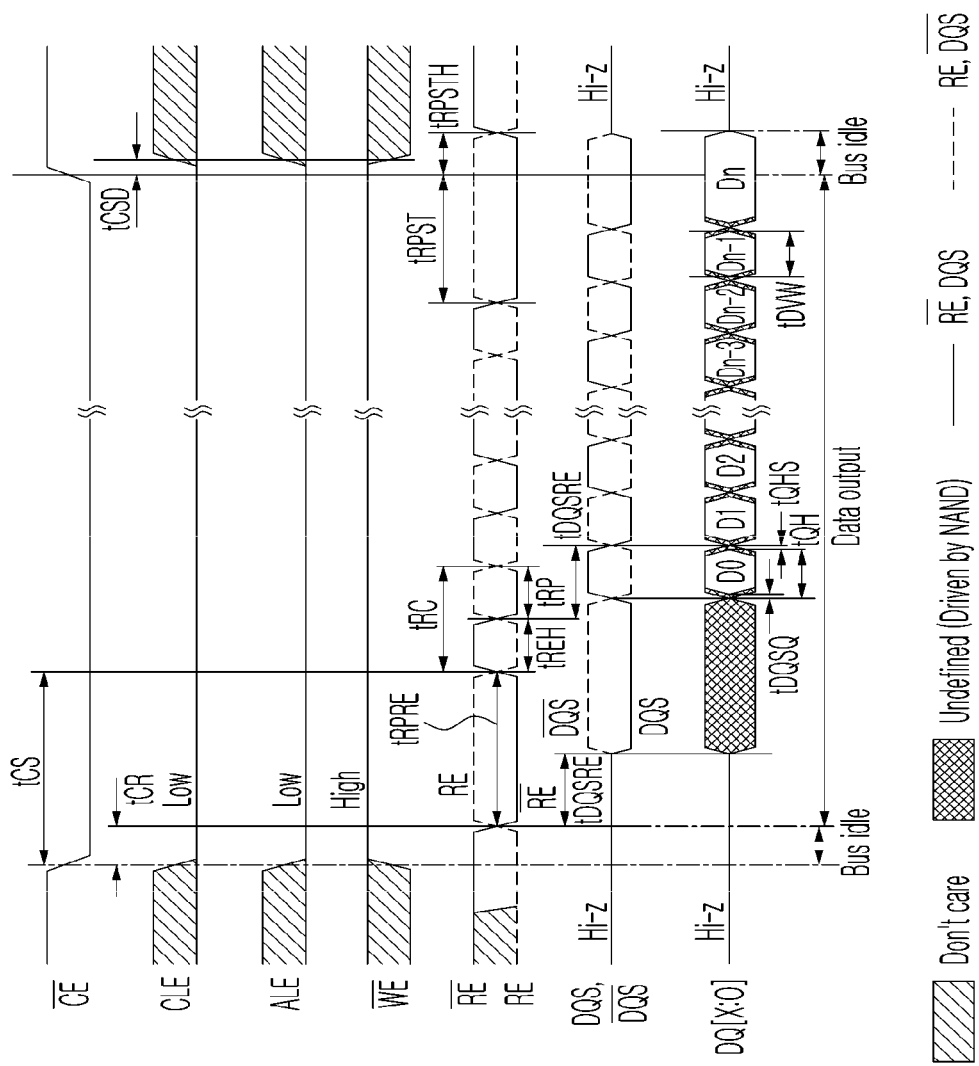
FIG. 5 is a timing diagram of main signals in a memory device according to an exemplary embodiment of the present invention.

FIG. 5 is a timing diagram of main signals in a memory device according to an exemplary embodiment of the present invention. Specifically, although FIG. 4 illustrates the case in which the memory device receives the command signal and the address signal and initiates the data read operation based on the command signal and the address signal, FIG. 5 illustrates a case in which a read operation is continuously performed.

Hereinafter, signals illustrated in FIG. 5 will be described with reference to FIG. 4. Unless described otherwise below, the description of FIG. 4 may be similarly applied to each of the signals.

Referring to FIG. 5, the memory device according to the exemplary embodiment of the present invention may receive an RE signal in a state where a CE signal is activated (falling), a CLE signal is deactivated (falling), an ALE signal is deactivated (falling), and a WE signal is deactivated (rising).

Referring to FIG. 5, the RE signal may be maintained in a logic low or logic high state for a read preamble time duration and subsequently periodically transitioned at periods of tRC. In this case, a DQS signal may be output in a waveform that is delayed for a time duration tDQSRE with respect to the RE signal. In other words, the DQS signal may be output asynchronous to the RE signal.

Referring to FIG. 5, a DQ signal may be synchronized with a DQS signal (that is, delayed for a time duration tDQSRE with respect to an RE signal), and output. After the time duration tDQSRE has elapsed, the DQ signal may sequentially output data D0 to Dn from a time point at which a time duration tRPRE has elapsed.

tDQSQ may refer to a skew between a DQ signal and a DQS signal. A parameter tQH may be an output hold time of the DQS signal, namely, a hold time of the DQS signal output by the memory device to an external device. A parameter tQHS may refer to a hold skew factor of the DQS signal. A parameter tDVW may refer to a valid window of data output as the DQ signal.

Hereinafter, a memory device and a control method of the memory device according to another exemplary embodiment of the present invention will be described. Specifically, an asynchronous NAND flash memory device configured such that an operation signal is output from the memory device in synchronization with an operation control signal input to the memory device and a control method of the asynchronous NAND flash memory device will be described below.

Meanwhile, a method of controlling a memory device disclosed herein may be performed by a control device (e.g., a memory controller).

The memory device according to the exemplary embodiment of the present invention may be an asynchronous NAND-type memory device and include a circuit configured to perform an operation based on a signal obtained from an external device, a first pin configured to receive an operation control signal from the external device, a second pin configured to output a data output reference signal to the external device, and a third pin configured to output data to the external device in synchronization with the data output reference signal.

In this case, the circuit configured to perform an operation based on a signal obtained from the external device may be provided such that the first pin receives, from the external device, an operation control signal that is transitioned at a second time point after a first time point at which the memory device enters into a ready state, and is subsequently periodically transitioned at first periods.

The memory device may further include a fourth pin configured to output a state signal indicating a ready state and a busy state of the memory device, and output the state signal indicating a state (i.e., a ready state or a busy state) of the memory device through the fourth pin. The fourth pin may be an R/B pin configured to output a ready/busy signal. Alternatively, the memory device may obtain a command signal input from the external device and output the state signal indicating a state of the memory device in response to the command signal. In this case, the command signal may be a signal for requesting the state of the memory device. The command signal may be received through a DQ pin.

In addition, the circuit configured to perform an operation based on a signal obtained from the external device may be provided such that the second pin outputs a data output reference signal that is transitioned at a third time point, which is later than the second time point by a predetermined time interval, and the data output reference signal is output in synchronization with the operation control signal which is periodically transitioned.

In addition, the circuit configured to perform an operation based on a signal obtained from the external device may be provided such that the third pin outputs data in synchronization with the operation control signal which is periodically transitioned, from the third time point.

The circuit according to the present embodiment may be implemented such that the data output reference signal is periodically transitioned at the same time point as a time point at which the operation control signal is periodically transitioned, or with a time difference which does not exceed a predetermined reference value from the time point at which the operation control signal is transitioned. In other words, a latency, which is a difference between the time point at which the operation control signal is transitioned and the time point at which the data output reference signal is transitioned, may be defined to have only a maximum value limitation. More specifically, tDQSRE, which is a difference between the time point at which the operation control signal is transitioned and the time point at which the data output reference signal is transitioned, may have a value of 0 ns to 25 ns. In the present embodiment, the first pin may be an RE pin configured to receive an RE signal. The second pin may be a DQS pin configured to output a DQS signal. The third pin may be a DQ pin configured to output data.

The circuit according to the present embodiment may output, through an R/B pin, a ready signal indicating that the memory device has entered into a ready state, at the first time point and obtain an RE signal through an RE pin in response to the output ready signal. The circuit may be provided such that when the RE signal is transitioned at the second time point after the first time point, the DQS signal is transitioned at the third time point, which is later than the second time point by a predetermined time interval.

The circuit may be provided such that the first pin outputs an operation control signal, which is first transitioned after the first time point, at the second time point and the second pin outputs a data output reference signal, which is first transitioned after the first time point, at the third time point.

The predetermined time interval, which is an interval between the second time point and the third time point, may be predetermined as an integer multiple of the first period.

The data may be output in alignment with an edge of the operation control signal. For example, a rising edge and a falling edge of a DQ signal may be respectively generated when a rising edge and a falling edge of the operation control signal are generated.

When the memory device according to the present embodiment is used, during a read operation of data, a DQS signal and a DQ signal, which are output by the memory device to the control device, may be synchronized with an RE signal output by the control device. Thus, as compared with a case in which the DQS signal and the DQ signal have waveforms, which are formed by delaying the RE signal, and asynchronous to the RE signal, it may be easy to manage signals at a side of the control device, so that a data processing speed may be increased.

The method of controlling a memory device according to the exemplary embodiment of the present invention may include outputting an operation control signal to the memory device, obtaining an operation reference signal from the memory device, and obtaining an operation signal from the memory device.

The operation of outputting the operation control signal may include outputting an operation control signal to the memory device when the memory device enters into a ready state at a first time point. In this case, the operation control signal may be transitioned at a second time point after the first time point and be subsequently periodically transitioned between a logic low and a logic high at first periods. The operation control signal may be an RE signal.

The operation of obtaining the operation reference signal may include obtaining the operation reference signal from the memory device in response to the operation control signal output to the memory device. The operation reference signal may be transitioned at a third time point, which is later than the second time point by a predetermined time interval, and be periodically transitioned between a logic low and a logic high. The operation reference signal may be a data output reference signal. The operation reference signal may be a DQS signal.

The obtaining of the operation signal may further include obtaining data output in synchronization with the operation reference signal from the third time point. The operation signal may be a DQ signal.

Figure 6:
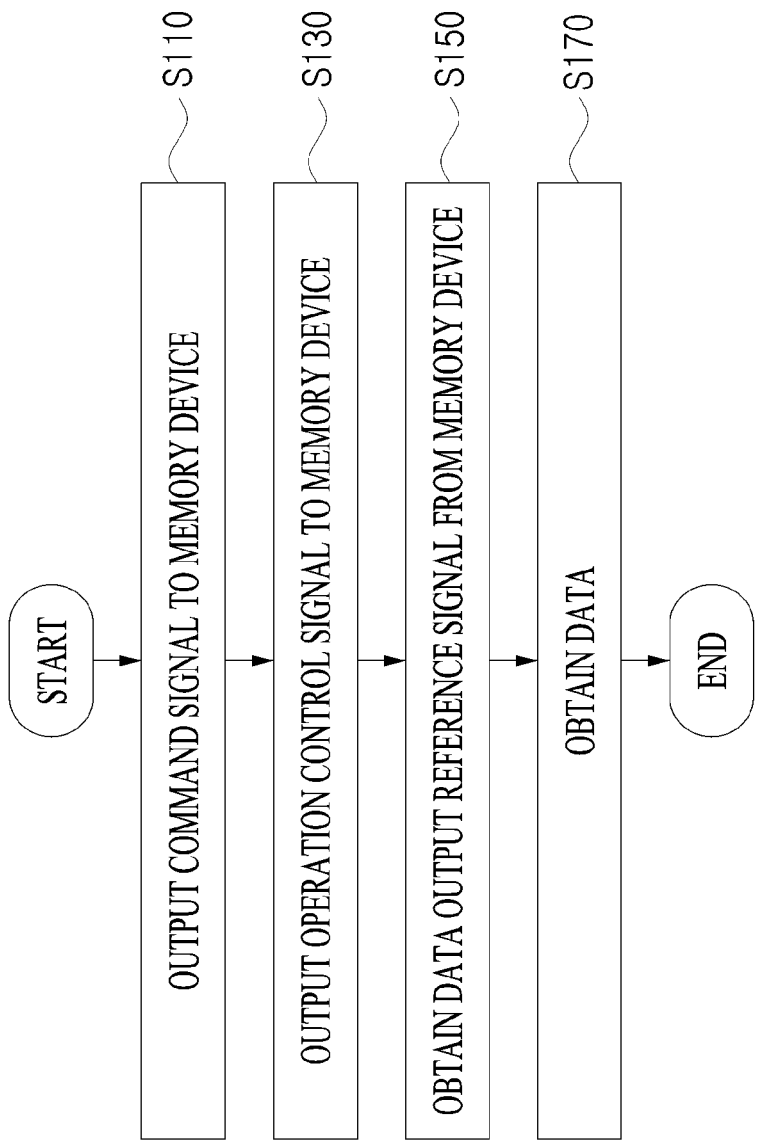
FIG. 6 is a flowchart of a method of controlling a memory device according to an exemplary embodiment of the present invention.

FIG. 6 is a flowchart of a method of controlling a memory device according to an exemplary embodiment of the present invention. The method of controlling the memory device, which is illustrated in FIG. 6, will be described in further detail with reference to FIGS. 8 to 10.

Referring to FIG. 6, a method of controlling a NAND-type memory device according to the exemplary embodiment of the present invention may include outputting a command signal to the memory device (S110), outputting an operation control signal to the memory device (S130), obtaining a data output reference signal from the memory device (S150), and obtaining data (S170).

The outputting of the command signal to the memory device (S110) may include outputting a data output (i.e., data read) command signal.

The outputting of the operation control signal to the memory device (S130) may further include outputting the operation control signal to the memory device when the memory device enters into a ready state at a first time point. In this case, the operation control signal may be transitioned at a second time point after the first time point, and be then periodically transitioned at first periods. The first time point may be a time point at which an R/B signal converts (rises) from a busy state to a ready state.

The outputting of the operation control signal (S130) may further include outputting the operation control signal, which is first transitioned after the first time point, at the second time point.

The operation control signal may be an RE signal, which is transmitted to the memory device through an RE pin of the memory device.

The obtaining of the data output reference signal from the memory device (S150) may further include obtaining a data output reference signal from the memory device in response to the operation control signal output to the memory device. In this case, the data output reference signal may be transitioned at a third time point, which is later than the second time point by a predetermined time interval, and output in synchronization with the operation control signal which is periodically transitioned.

The obtaining of the data output reference signal (S150) may further include obtaining a data output reference signal, which is first transitioned after the first time point, at the third time point.

The predetermined time interval, which is an interval between the second time point and the third time point, may be predetermined as an integer multiple of the first period. For example, a predetermined time interval between the second time point and the third time point may be the double of the first period.

The data output reference signal may be a DQS signal, which is received from the memory device through a DQS pin of the memory device.

The obtaining of data (S170) may include obtaining data, which is output in synchronization with the data output reference signal, from the third time point. The data may be a DQ signal output from the memory device through a DQ pin of the memory device.

The data may be output in alignment with an edge of the operation control signal. In other words, a rising edge and a falling edge of a data signal may be respectively generated at time points at which a rising edge and a falling edge of the operation control signal are generated. Alternatively, the rising edge and the falling edge of the data signal may be respectively generated at time points at which a falling edge and a rising edge of the operation control signal are generated.

As described above, the operation reference signal (or the DQS signal) and the operation signal (or the DQ signal) may be periodically transitioned in synchronization with the operation control signal (or the RE signal), thereby improving a data processing speed.

In other words, unlike the present invention, when the operation reference signal (or the DQS signal) and the operation signal (or the DQ signal) are delayed for a predetermined time (e.g., tDQSRE) with respect to the operation control signal and output asynchronous to the operation control signal (or the RE signal), the predictability of a signal received by a control device may be low due to a transition time point of the operation reference signal (or the RE signal) output by the control device and a phase difference of the operation signal (or the DQ signal) obtained by the control device. Thus, there may be a limit in data processing speed.

A specific example will be described. When the DQS signal and the DQ signal are synchronized with the RE signal as disclosed in the present invention, the RE signal output by the control device may coincide with a valid window determined by the DQS signal. Thus, the predictability of data output by the memory device may increase in the control device, thereby markedly increasing a data processing speed in the control device.

In addition, unlike a related art in which an additional clock signal CLK is used and a data output is synchronized with the clock signal CLK to achieve high speed, the present invention may enable high-speed data processing with low power without using a clock signal CLK.

The control method of a memory device according to the exemplary embodiment of the present invention may include obtaining an operation control signal from an external device, outputting an operation reference signal to the external device, and outputting an operation signal to the external device.

The obtaining of the operation control signal may include allowing the memory device to enter into a ready state and receiving the operation control signal from the external device. The operation control signal may be transitioned at a second time point after a first time point at which the memory device enters into the ready state, and be periodically transitioned between a logic low and a logic high. The operation control signal may be an RE signal.

The outputting of the operation reference signal may include outputting the operation reference signal to the external device in response to the operation control signal obtained from the external device. The operation reference signal may be transitioned at a third time point, which is later than the second time point by a predetermined time interval, and be periodically transitioned between a logic low and a logic high. The operation reference signal may be a DQS signal.

The outputting of the operation signal may include outputting data in synchronization with the operation reference signal. The operation signal may be a DQ signal.

Figure 7:
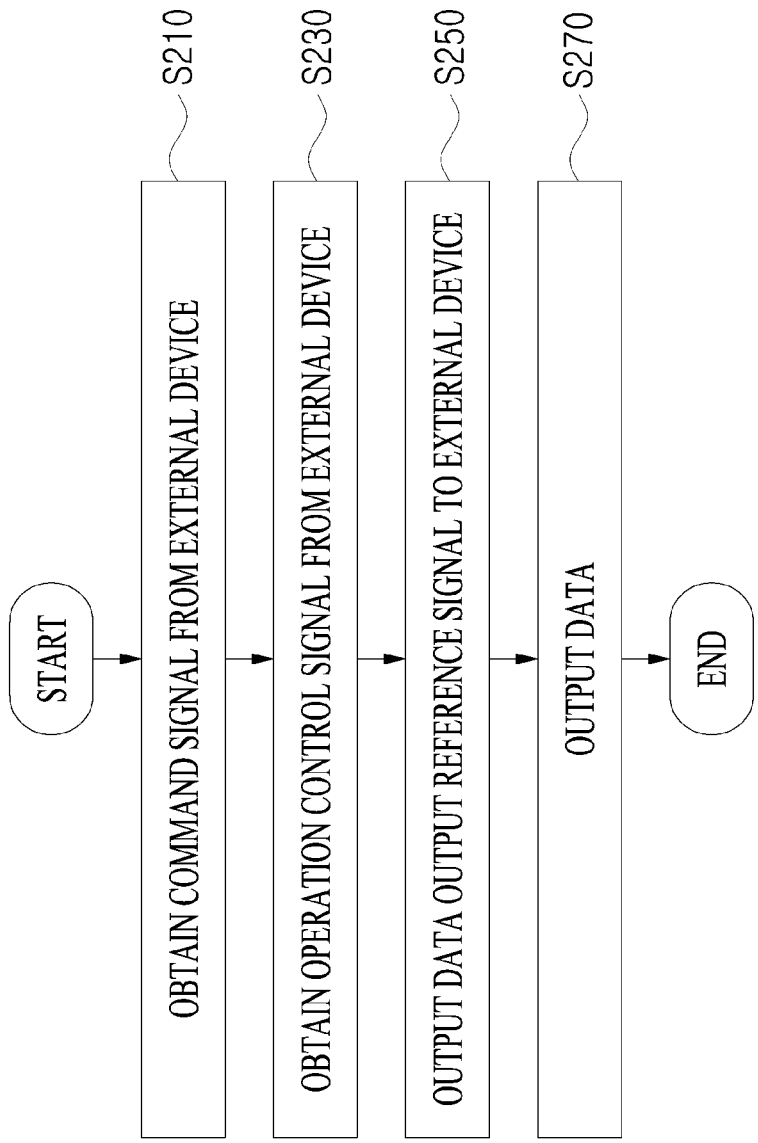
FIG. 7 is a flowchart of a control method of a NAND-type memory device according to an exemplary embodiment of the present invention.

FIG. 7 is a flowchart of a control method of a NAND-type memory device, according to an exemplary embodiment of the present invention. The control method of the memory device, which is illustrated in FIG. 7, will be described in detail below with reference to FIGS. 8 to 10.

Referring to FIG. 7, the control method of the NAND-type memory device, according to the exemplary embodiment of the present invention, may include obtaining a command signal from an external device (S210), obtaining an operation control signal from the external device (S230), outputting a data output reference signal to the external device (S250), and outputting data (S270).

The obtaining of the command signal from the external device (S210) may include obtaining a data output command signal (i.e., a data read command signal).

The obtaining of the operation control signal from the external device (S230) may include allowing the memory device to enter into a ready state and receiving the operation control signal from the external device. In this case, the operation control signal may be transitioned at a second time point after a first time point at which the memory device enters into the ready state.

The obtaining of the operation control signal (S230) may further include outputting the operation control signal, which is first transitioned after the first time point, at the second time point.

The operation control signal may be an RE signal, which is transmitted to the memory device through an RE pin of the memory device.

The outputting of the data output reference signal to the external device (S250) may further include outputting the data output reference signal to the external device in response to the operation control signal obtained from the external device. The data output reference signal may be transitioned at a third time point, which is later than the second time point by a predetermined time interval. After the data output reference signal is transitioned at the third time point, the data output reference signal may be output in synchronization with the operation control signal which is periodically transitioned.

The outputting of the data output reference signal (S250) may further include outputting the data output reference signal, which is first transitioned after the first time point, at the third time point.

The predetermined time interval, which is an interval between the second time point and the third time point, may be predetermined as an integer multiple (an n multiple) of a first period. For example, the predetermined time interval between the second time point and the third time point may be the double of the first period.

The data output reference signal may be a DQS signal, which is received from the memory device through a DQS pin of the memory device.

The outputting of the data (S270) may include outputting the data in synchronization with the data output reference signal. The data may be output as the type of a DQ signal, which is output from the memory device through a DQ pin of the memory device.

The data may be output in alignment with an edge of the operation control signal. In other words, a rising edge and a falling edge of a data signal may be respectively generated at time points at which a rising edge and a falling edge of the operation control signal are generated.

As described above, the memory device may be controlled such that the operation reference signal (or the DQS signal) and the operation signal (or the DQ signal) are periodically transitioned in synchronization with the operation control signal (or the RE signal). Thus, predictability of receiving data in a control device may be enhanced, thereby improving a data processing speed.

Figure 8:
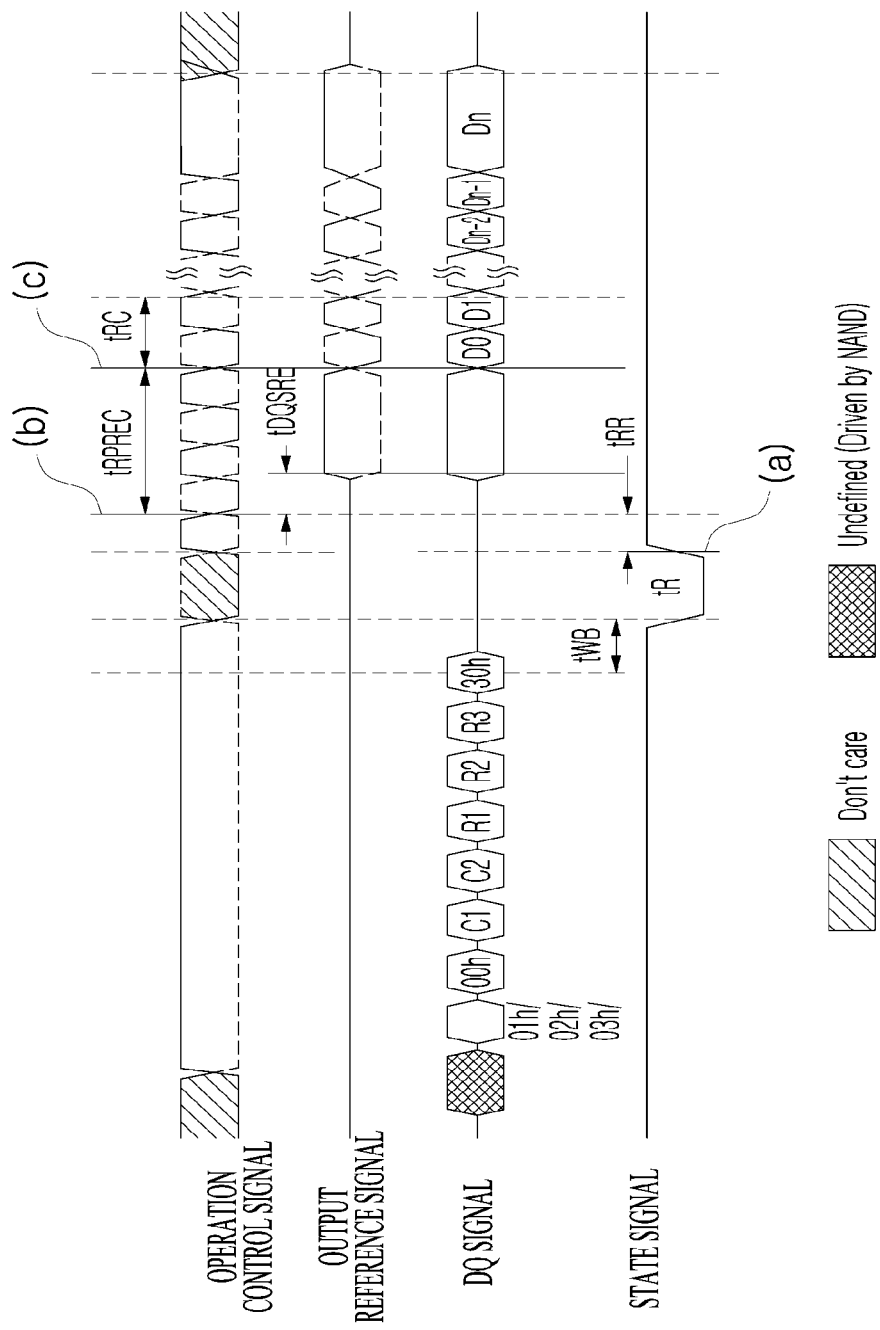
FIG. 8 is a timing diagram of main signals in a memory device according to an exemplary embodiment of the present invention.

FIG. 8 is a timing diagram of main signals in a memory device according to an exemplary embodiment of the present invention.

Referring to FIG. 8, in a state in which a state signal rises at a first time point a, the memory device according to the exemplary embodiment of the present invention may receive an operation control signal, which is transitioned at a second time point b and is subsequently periodically transitioned between a logic high and a logic low at periods of tRC. In this case, the memory device may output a data output reference signal, which is transitioned at a third time point c after the first time point a, and a DQ signal in synchronization with the data output reference signal.

In this case, a time interval between the second time point b and the third time point c may be predetermined. The time interval between the second time point b and the third time point c may be determined as an integer multiple of tRC. Referring to FIG. 8, a time interval tRPREC between the second time point b and the third time point c may be determined as the double of tRC.

As in the present invention, when a DQS signal and an operation signal are synchronized with an RE signal output by a control device, tDQSRE for which the DQS signal is delayed with respect to the RE signal may not have a minimum value limitation but be defined as having only a maximum value limitation. Thus, designs for processing data may be simplified, and the processing of data may be improved.

Furthermore, according to the present invention, in terms of a relationship between the RE signal and the DQS signal, since a relationship between a time point at which the RE signal is (firstly) transitioned and a time point at which the outputting of data begins may be counted in cycle units, the handling of data in the control device may be facilitated.

Figure 9:
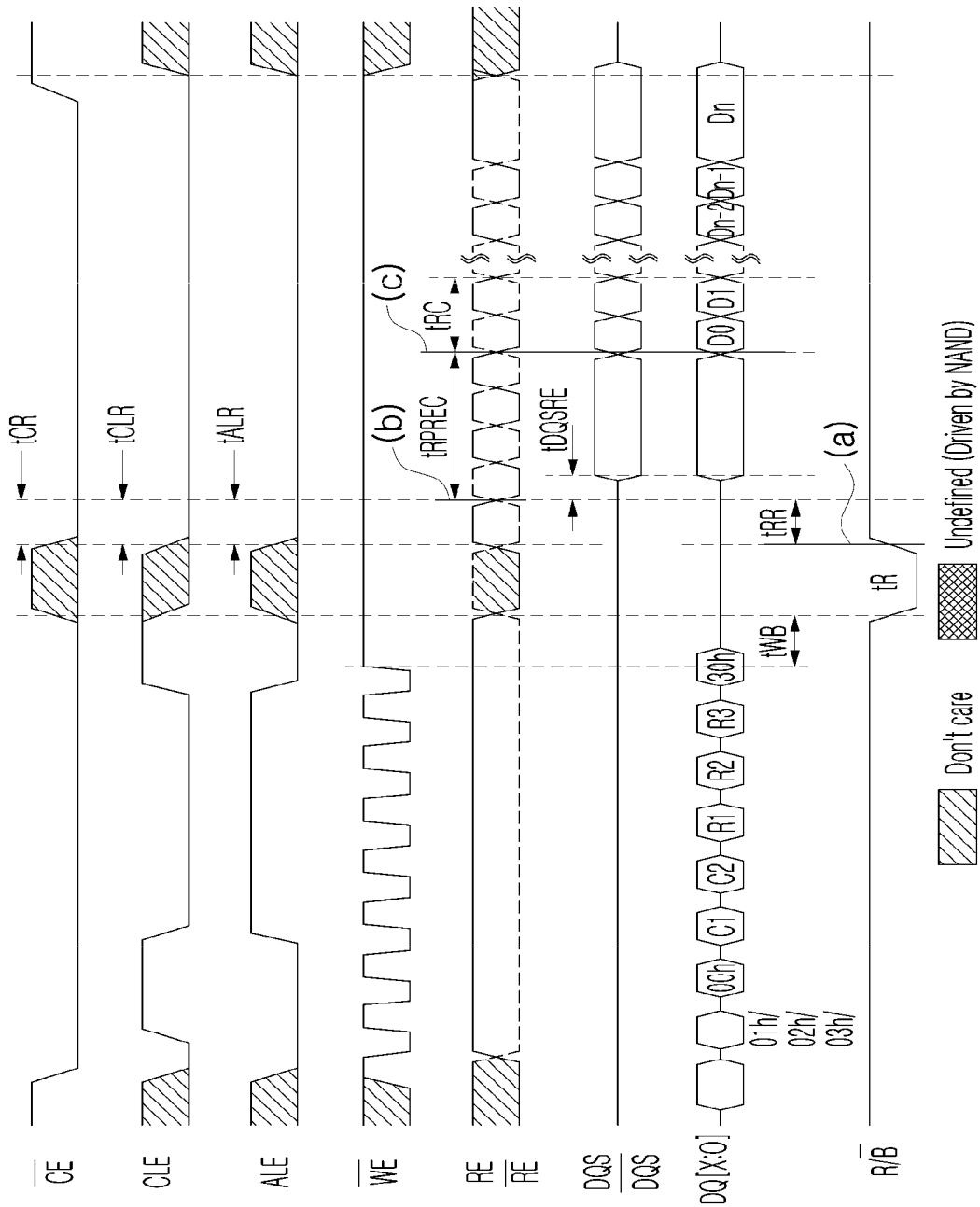
FIG. 9 is a timing diagram of main signals in a memory device according to an exemplary embodiment of the present invention.

FIG. 9 is a timing diagram of main signals in a memory device according to an exemplary embodiment of the present invention. Specifically, FIG. 9 illustrates the main signals when the memory device starts to read data.

Unless described otherwise below, the description of FIG. 4 may be similarly applied to each of the signals.

Referring to FIG. 9, in a state in which an R/B signal converts from a busy state to a ready state at a first time point a, the memory device may obtain an RE signal, which is transitioned at a second time point b and is periodically transitioned. Further, the memory device may output a DQS signal, which is transitioned at a third time point c after the first time point a, and output a DQ signal in synchronization with a data output reference signal.

More specifically, when a time duration tRR has elapsed from the first time point a at which the R/B signal converted from the busy state to the ready state, the memory device may obtain an RE signal, which is transitioned at the second time point b and is periodically transitioned for periods of tRC. The memory device may output a DQS signal, which is transitioned at the third time point c, which is later than the second time point b by a time duration tRPREC, and subsequently synchronized with the RE signal.

When comparing with FIG. 4, in the embodiment illustrated in FIG. 9, unlike the embodiment illustrated in FIG. 4, the DQS signal and the DQ signal may be output in synchronization with the RE signal. In other words, in the embodiment illustrated in FIG. 9, falling or rising edges of the DQS signal and the DQ signal may be output in alignment with a falling or rising edge of the RE signal. Accordingly, a control device may receive data more smoothly and rapidly.

Figure 10:
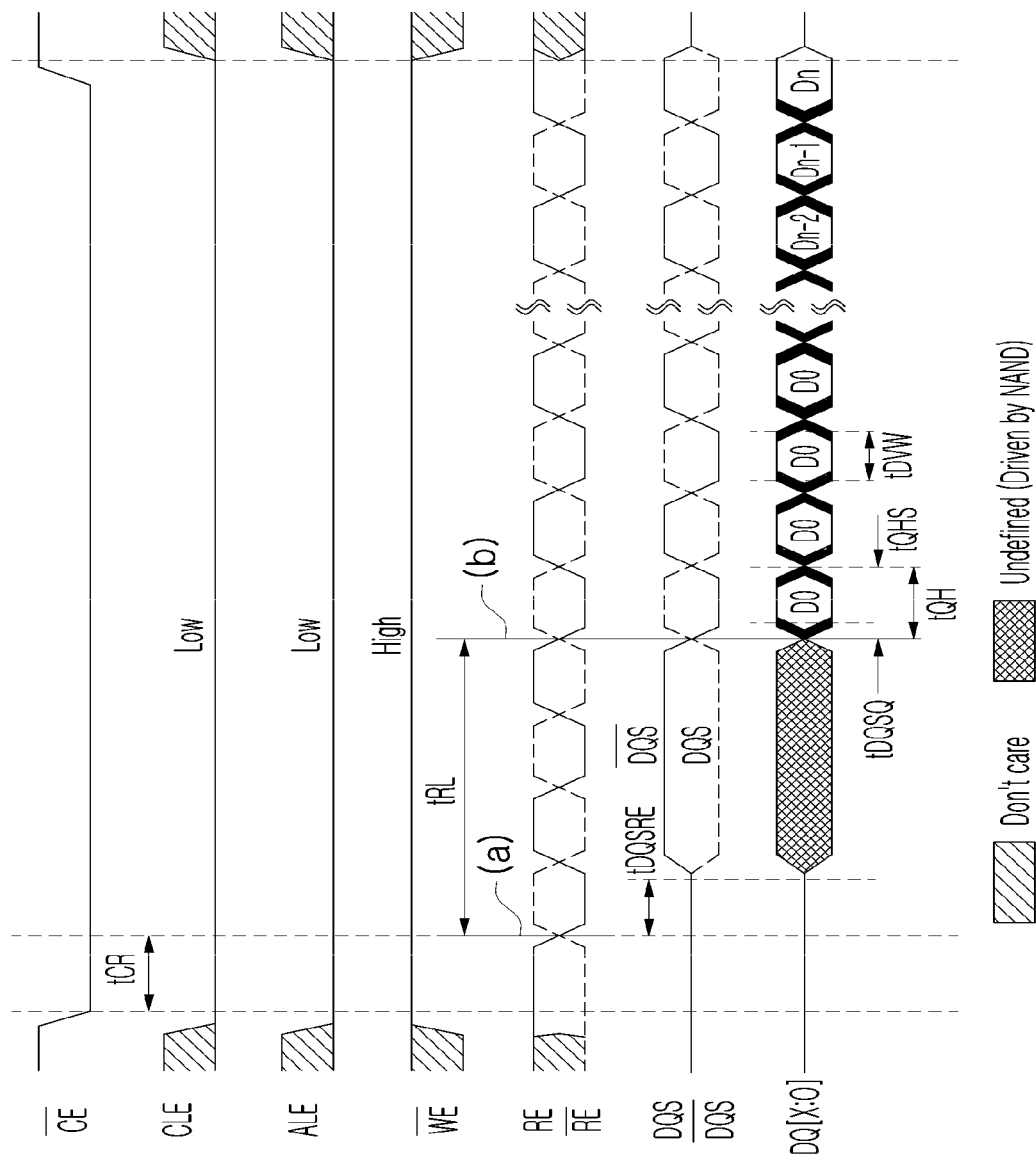
FIG. 10 is a timing diagram of main signals in a memory device according to an exemplary embodiment of the present invention.

FIG. 10 is a timing diagram of main signals in a memory device according to an exemplary embodiment of the present invention. Specifically, FIG. 10 illustrates time points of the main signals when the memory device continuously reads data.

Unless described otherwise below, the descriptions of FIGS. 5 and 9 may be similarly applied to each of the signals.

Referring to FIG. 10, the memory device according to the exemplary embodiment of the present invention may obtain an RE signal, which is transitioned at a first time point a and is then periodically transitioned between a logic high and a logic low, output a DQS signal, which is transitioned at a second time point b, which is later than the first time point a by a predetermined time interval, and is subsequently periodically transitioned, and output a DQ signal in synchronization with the DQS signal at the second time point b.

Specifically, the memory device according to the exemplary embodiment of the present invention may obtain an RE signal, which is transitioned at the first time point a and is subsequently periodically transitioned, output a DQS signal, which is transitioned at the second time point b that is later than the first time point a by tRL, and output a DQ signal in synchronization with the DQS signal.

A parameter tRL may denote an RE latency. The parameter tRL may be given in cycle units. A cycle may refer to a period (i.e., tRC) of the RE signal. The parameter tRL may vary according to a processing speed. For example, when a processing speed is 100 MHz or 133 MHz, the parameter tRL may be 3 cycles. When the processing speed is 166 MHz or 200 MHz, the parameter tRL may be 4 cycles. When the processing speed is 266 MHz, the parameter tRL may be 5 cycles. The parameter tRL may be differently set in an on-die termination (ODT) mode. For example, the parameter tRL may be set to be relatively large in the ODT mode.

Meanwhile, as shown in FIG. 10, in the memory device according to the present invention, since a data skew tDQSQ is based on the DQS signal, which is synchronized with the RE signal, which is an output signal of a control device, a substantial data skew may be ensured so that a high-speed operation may be facilitated.

According to another exemplary embodiment of the present invention, a memory device configured to perform a signal processing operation according to a selected one of the two modes of signal processing described above may be provided. Specifically, a memory device configured to provide a different signal response system based on a control command input from a controller may be provided.

Specifically, the memory device may include a circuit configured to perform an operation based on a signal obtained from an external device, a first pin configured to obtain an operation control signal from the external device, a second pin configured to output a data output reference signal to the external device, and a third pin configured to output data to the external device. The circuit may have a plurality of modes including a first mode and a second mode, and be provided to operate based on any one of the plurality of modes based on a mode selection signal input from the external device.

The above-described mode selection signal may be provided in the form of a command. In other words, the memory device (or a circuit of the memory device) may obtain a mode selection command through a DQ pin for obtaining a command signal, and operate based on the mode selection command.

The above-described circuit may set the second mode by default and change so as to operate in any one of the plurality of modes based on the mode selection signal. Alternatively, the circuit may be configured to operate in the second mode when any other particular mode selection signal is not obtained.

The circuit may be provided such that the first pin obtains an operation control signal from the external device, the second pin outputs the data output reference signal in response to the operation control signal, and the third pin outputs data in synchronization with the data output reference signal.

As an example, in a first mode, the circuit may be provided such that the data output reference signal is delayed for a predetermined time delay with respect to the operation control signal and output asynchronous to the operation control signal.

Specifically, in the first mode, the circuit may be provided such that the first pin obtains the operation control signal from the external device from a fifth time point after a fourth time point at which the memory device enters into a ready state and the second pin outputs a data output reference signal from a sixth time point, which is later than the second time point by a predetermined time interval. The circuit may be provided such that the data output reference signal may be delayed for a predetermined time (e.g., tDQSRE) with respect to an operation control signal, which is periodically transitioned, and output, and the third pin outputs data in synchronization with the data output reference signal.

In addition, in the first mode, the circuit may operate similarly to the operation described above with reference to FIGS. 4 and 5.

As another example, in the second mode, the circuit may be provided to output a data output reference signal in synchronization with the operation control signal.

Specifically, in the second mode, the circuit may be provided such that the first pin obtains, from the external device, an operation control signal that is transitioned at the second time point after the first time point at which the memory device enters into the ready state, and is subsequently periodically transitioned at first periods, and the second pin outputs the data output reference signal at a third time point, which is later than the second time point by a predetermined time interval. The data output reference signal may be output in synchronization with the operation control signal which is periodically transitioned. The circuit may be provided such that the third pin outputs data in synchronization with the operation control signal which is periodically transitioned, from the third time point.

In an example of the memory device, the first pin may be an RE pin configured to obtain a read enable signal, the second pin may be a DQS pin configured to output a data strobe signal, and the third pin may be a DQ pin configured to output a data I/O signal.

In this case, in the second mode, the circuit may be provided to output a ready signal indicating that the memory device has entered into the ready state, at the first time point, and obtain the read enable signal through the RE pin in response to the output ready signal. The circuit may be provided such that when the read enable signal is transitioned at the second time point after the first time point, the data strobe signal may be transitioned at the third time point, which is later than the second time point by the predetermined time interval.

In addition, the predetermined time interval, which is an interval between the second time point and the third time point, may be predetermined as an integer multiple of the first period.

The circuit may be provided such that the first pin outputs the operation control signal, which is first transitioned after the first time point, at the second time point and the second pin outputs the data output reference signal, which is first transitioned after the first time point, at the third time point.

In addition, although not specifically described in the present embodiment, in the second mode, the circuit may operate similarly to the operations described above with reference to FIGS. 6 to 10.

Although only the first mode and the second mode of the memory device (or the circuit) included in the memory device have been described in the above embodiments, the present invention is not limited thereto. In other words, the memory device may further have a third mode other than the first mode and the second mode and operate in a selected mode based on a command of the control device.

Figure 11:
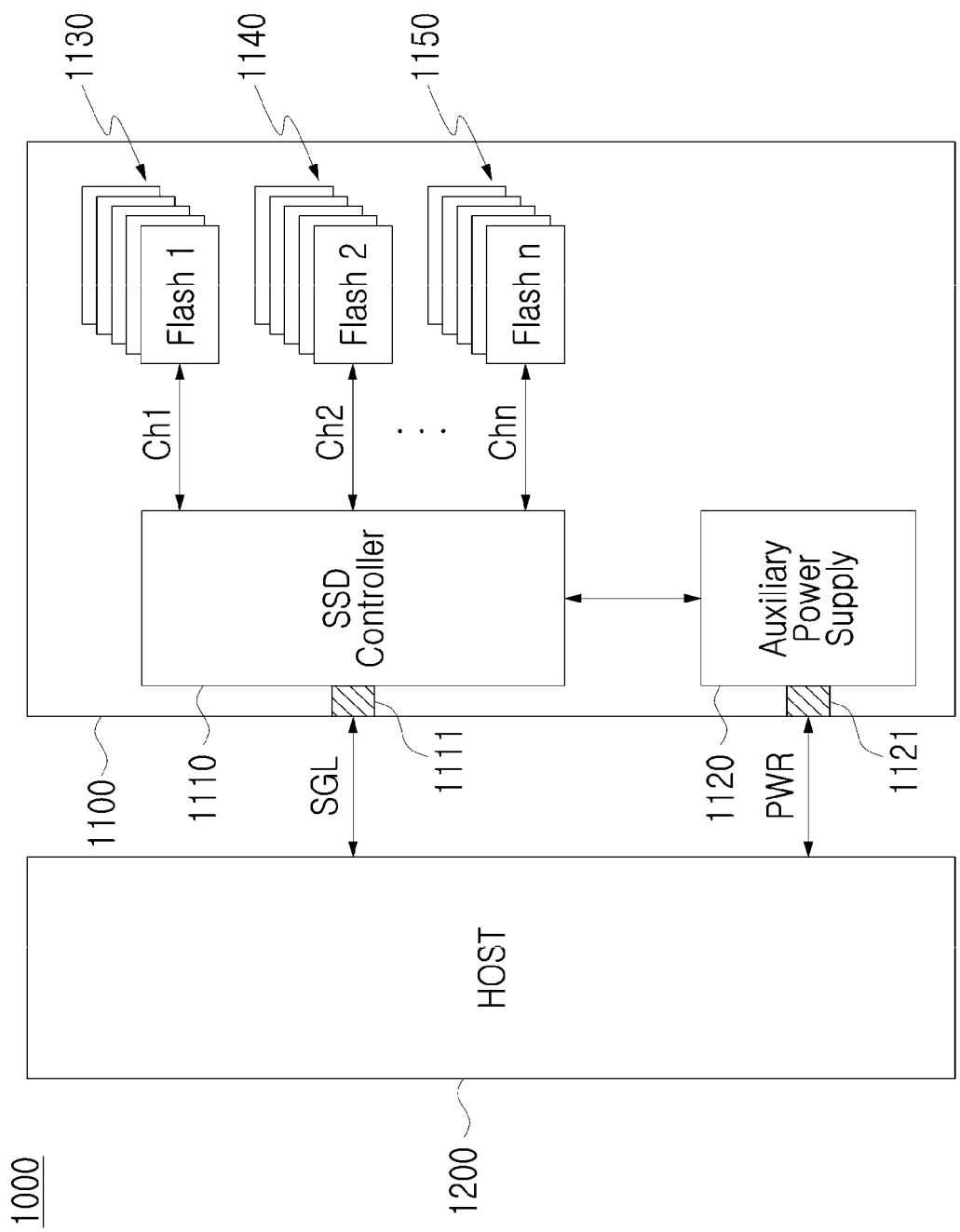
FIG. 11 is a block diagram of a system in which a memory device according to an exemplary embodiment of the present invention is applied to a solid-state drive (SSD).

FIG. 11 is a block diagram of a system in which a memory device according to an exemplary embodiment of the present invention is applied to a solid-state drive (SSD).

Referring to FIG. 11, an SSD system 1000 may include a host 1200 and an SSD 1100. The SSD 1100 may exchange signals with the host 1200 through a signal connector 1111. The SSD 1100 may receive power through a power connector 1121. The SSD 1100 may include an SSD controller 1110, an auxiliary power supply 1120, and a plurality of memory devices 1130, 1140, and 1150. In this case, the SSD controller 1110 may be implemented in the form of a memory controller disclosed herein. Each of the memory devices 1130, 1140, and 1150 may be implemented in the form of a memory device disclosed herein.

According to the present invention, an asynchronous NAND-type memory device, a control method of the asynchronous NAND-type memory device, and a method of controlling the memory device can be provided.

According to the present invention, a memory device having an improved data processing speed, a control method of the memory device, and a method of controlling the memory device can be provided.

According to the present invention, a memory device having enhanced data processing stability, a control method of the memory device, and a method of controlling the memory device can be provided.

Effects of the present invention should not be limited by the above-described effects, and other unmentioned effects will be clearly understood by one of ordinary skill in the art from the present specification and the accompanying drawings.

Although the present invention has been particularly shown and described with reference to the limited embodiments and drawings, one skilled in the art knows that various changes and modifications may be made without departing from the spirit and scope of the present invention. For example, even if described techniques are performed in a different order from that in a described method, and/or even if components of described systems, structures, devices, circuits, and the like are combined in a different form from that in a described method or replaced or substituted by other components or equivalents, appropriate results may be obtained.

Therefore, other implementations, other embodiments and equivalents of the claims fall within the scope of the following claims.

The invention claimed is:

1. A memory device which is an asynchronous NAND-type memory device, the memory device comprising:
a circuit configured to perform an operation based on a signal obtained from an external device;
a first pin configured to obtain an operation control signal from the external device;
a second pin configured to output a data output reference signal to the external device; and
a third pin configured to output data to the external device in synchronization with the data output reference signal,
wherein the circuit is provided such that the first pin obtains, from the external device, the operation control signal that is transitioned at a second time point after a first time point at which the memory device enters into a ready state, and is subsequently periodically transitioned at first periods,
the second pin outputs the data output reference signal, which is transitioned at a third time point that is later than the second time point by a predetermined time interval, the data output reference signal being output in synchronization with the operation control signal which is periodically transitioned, and
the third pin outputs the data in synchronization with the operation control signal which is periodically transitioned, from the third time point,
wherein the operation control signal is a read enable signal, the data output reference signal is a data strobe signal and the output data is output by a data signal, and
wherein the operation control signal is longer than the data output reference signal by at least a predetermined time interval, thereby the output data is output in synchronization with both of the operation control signal and the data output reference signal until output of the data is completed.

2. The memory device of claim 1, wherein the first pin is a RE pin configured to obtain a read enable signal,
the second pin is a DQS pin configured to output a data strobe signal, and
the third pin is a DQ pin configured to output a data input/output signal,
wherein the circuit outputs a ready signal indicating that the memory device has entered into the ready state at the first time point and obtains the read enable signal through the RE pin in response to the output ready signal, and when the read enable signal is transitioned at the second time point after the first time point, the data strobe signal is transitioned at the third time point, which is later than the second time point by a predetermined time interval.

3. The memory device of claim 1, wherein the circuit is provided such that the first pin outputs the operation control signal, which is first transitioned after the first time point, at the second time point, and the second pin outputs the data output reference signal, which is first transitioned after the first time point, at the third time point.

4. The memory device of claim 1, wherein the predetermined time interval, which is an interval between the second time point and the third time point, is predetermined as an integer multiple of the first period.

5. The memory device of claim 1, wherein the circuit is implemented such that the data output reference signal is periodically transitioned at the same time point as a time point at which the operation control signal is periodically transitioned, or with a time difference which does not exceed a predetermined reference value from the time point at which the operation control signal is transitioned.

6. The memory device of claim 1, wherein the data is output in alignment with an edge of the operation control signal.

7. A method of controlling a memory device which is a NAND-type memory device, the method comprising:
outputting an operation control signal to the memory device when the memory device enters into a ready state at a first time point, wherein the operation control signal is transitioned at a second time point after the first time point and is subsequently periodically transitioned at first periods;
obtaining a data output reference signal from the memory device in response to the operation control signal output to the memory device, wherein the data output reference signal is transitioned at a third time point, which is later than the second time point by a predetermined time interval, and output in synchronization with the operation control signal which is periodically transitioned; and
obtaining data output in synchronization with the data output reference signal from the third time point
wherein the operation control signal is a read enable signal, the data output reference signal is a data strobe signal and the output data is output by a data signal, and
wherein the operation control signal is longer than the data output reference signal by at least a predetermined time interval, thereby the output data is output in synchronization with both of the operation control signal and the data output reference signal until output of the data is completed.

8. The method of claim 7, wherein the operation control signal is a read enable signal transmitted to the memory device through a RE pin of the memory device,
the data output reference signal is a data strobe signal obtained from the memory device through a DQS pin of the memory device, and
the data is output from the memory device through a DQ pin of the memory device.

9. The method of claim 7, wherein the predetermined time interval, which is an interval between the second time point and the third time point, is predetermined as an integer multiple of the first period.

10. The method of claim 7, wherein the data is output in alignment with an edge of the operation control signal.

11. The method of claim 7, wherein the outputting of the operation control signal further comprises outputting the operation control signal, which is first transitioned after the first time point, at the second time point, and
the obtaining of the data output reference signal further comprises obtaining the data output reference signal, which is first transitioned after the first time point, at the third time point.

12. A control method of a memory device which is a NAND-type memory device, the method comprising:
allowing the memory device to enter into a ready state and obtaining an operation control signal from an external device, wherein the operation control signal is transitioned at a second time point after a first time point at which the memory device enters into the ready state;
outputting a data output reference signal to the external device in response to the operation control signal obtained from the external device, wherein the data output reference signal is transitioned at a third time point, which is later than the second time point by a predetermined time interval; and outputting data in synchronization with the data output reference signal, wherein the operation control signal is a read enable signal, the data output reference signal is a data strobe signal and the output data is output by a data signal, and wherein the operation control signal is longer than the data output reference signal by at least a predetermined time interval, thereby the output data is output in synchronization with both of the operation control signal and the data output reference signal until output of the data is completed.

13. The method of claim 12, wherein the operation control signal is a read enable signal transmitted to the memory device through a RE pin of the memory device, the data output reference signal is a data strobe signal obtained from the memory device through a DQS pin of the memory device, and the data is output from the memory device through a DQ pin of the memory device.

14. The method of claim 12, wherein the obtaining of the operation control signal further comprises obtaining the operation control signal, which is first transitioned after the first time point, at the second time point, and the outputting of the data output reference signal further comprises outputting the data output reference signal, which is first transitioned after the first time point, at the third time point.

15. The method of claim 12, wherein the predetermined time interval, which is an interval between the second time point and the third time point, is predetermined as an integer multiple of the first period.

16. The method of claim 12, wherein the data is output in alignment with an edge of the operation control signal.

17. A memory device which is a NAND-type memory device, the memory device comprising:

a circuit configured to perform an operation based on a signal obtained from an external device;

a first pin configured to obtain an operation control signal from the external device;

a second pin configured to output a data output reference signal to the external device; and a third pin configured to output data to the external device, wherein the circuit is provided such that the first pin obtains the operation control signal from the external device, the second pin outputs the data output reference signal in response to the operation control signal, and the third pin outputs the data in synchronization with the data output reference signal, wherein the circuit has a plurality of modes including a first mode in which the data output reference signal is delayed for a predetermined time delay with respect to the operation control signal and output asynchronous to the operation control signal and a second mode in which the data output reference signal is output in synchronization with the operation control signal, and the circuit is provided to operate in any one of the plurality of modes based on a mode selection signal input from the external device, wherein the operation control signal is a read enable signal, the data output reference signal is a data strobe signal and the output data is output by a data signal, and wherein the data output reference signal is longer than the data output by at least a predetermined time interval, thereby the output data is output in synchronization with both of the operation control signal and the data output reference signal until output of the data is completed.

18. The memory device of claim 17, wherein the first pin is a RE pin configured to obtain a read enable signal, the second pin is a DQS pin configured to output a data strobe signal, and the third pin is a DQ pin configured to output a data input/output signal, wherein the circuit outputs a ready signal indicating that the memory device has entered into a ready state at a first time point and obtains the read enable signal through the RE pin in response to the output ready signal, and when the read enable signal is transitioned at a second time point after the first time point, the data strobe signal is transitioned at a third time point, which is later than the second time point by a predetermined time interval.

19. The memory device of claim 18, wherein the circuit is provided such that the first pin outputs the operation control signal, which is first transitioned after the first time point, at the second time point and the second pin outputs the data output reference signal, which is first transitioned after the first time point, at the third time point.

20. The memory device of claim 18, wherein the predetermined time interval, which is an interval between the second time point and the third time point, is predetermined as an integer multiple of a first period.

21. The memory device of claim 17, wherein the circuit sets the second mode by default and changes into any one of the plurality of modes based on the mode selection signal.

* * * * *